United States Patent [19]
Akram et al.

[11] Patent Number: 5,607,818
[45] Date of Patent: Mar. 4, 1997

[54] METHOD FOR MAKING INTERCONNECTS AND SEMICONDUCTOR STRUCTURES USING ELECTROPHORETIC PHOTORESIST DEPOSITION

[75] Inventors: Salman Akram, Boise; Warren Farnworth, Nampa; David R. Hembree, Boise, all of Id.

[73] Assignee: Micron Technology, Inc., Boise, Id.

[21] Appl. No.: 452,798

[22] Filed: May 30, 1995

Related U.S. Application Data

[63] Continuation-in-part of Ser. No. 387,687, Feb. 13, 1995, which is a continuation of Ser. No. 137,675, Oct. 14, 1993, abandoned, which is a continuation-in-part of Ser. No. 709,858, Jun. 4, 1991, abandoned, Ser. No. 788,065, Nov. 5, 1991, Pat. No. 5,440,240, and Ser. No. 981,956, Nov. 24, 1992, Pat. No. 5,539,324.

[51] Int. Cl.$^6$ .................................................. G03C 5/00
[52] U.S. Cl. ...................... 430/311; 430/9; 430/313; 430/315; 430/318; 204/478; 204/485
[58] Field of Search .......................... 430/5, 9, 311, 430/313, 314, 315, 318; 204/180.1, 180.2, 180.6

[56] References Cited

U.S. PATENT DOCUMENTS

| | | | |
|---|---|---|---|
| 4,592,816 | 6/1986 | Emmons et al. | 208/180.6 |
| 4,592,826 | 6/1986 | Ganguli | 208/407 |
| 4,985,116 | 1/1991 | Mettler et al. | 156/656 |
| 5,004,672 | 4/1991 | D'Ottavio et al. | 430/314 |
| 5,326,428 | 7/1994 | Farnworth et al. | 156/654 |
| 5,354,705 | 10/1994 | Mathews et al. | 437/52 |
| 5,408,190 | 4/1995 | Wood et al. | 324/765 |
| 5,419,807 | 5/1995 | Akram et al. | 156/647.1 |
| 5,440,240 | 8/1995 | Wood et al. | 324/765 |
| 5,478,779 | 12/1995 | Akram | 437/189 |
| 5,483,174 | 1/1996 | Hembree et al. | 324/765 |
| 5,483,741 | 1/1996 | Akram et al. | 29/846 |
| 5,495,179 | 2/1996 | Wood et al. | 324/755 |
| 5,523,697 | 6/1996 | Farnworth et al. | 324/758 |

OTHER PUBLICATIONS

"PEPR™ XP-2305 Positive Electrodeposited Photo Resist", Shipley, 1994.

*Primary Examiner*—S. Rosasco
*Attorney, Agent, or Firm*—Stephen A. Gratton

[57] ABSTRACT

A method for electrophoretically depositing a layer of photoresist on a non-planar silicon structure and a method for forming a non-planar silicon structure using electrophoretic deposition are provided. The method comprises forming a silicon substrate with a non-planar topography and forming a conductive layer on the substrate. The substrate is then submerged in an electrolytic bath containing a photoresist solution comprising a polymer and a charged carrier group. At the same time the conductive layer is connected to a voltage source and to a non-sacrificial electrode and electrically biased. The biased conductive layer attracts the carrier group and causes a layer of photoresist to uniformly deposit on the conductive layer. The layer of photoresist can then be exposed and developed to form a photomask for etching the conductive layer. In an illustrative embodiment the silicon structure is an interconnect for testing unpackaged semiconductor dice. In another embodiment the silicon structure is a semiconductor structure having a dielectric layer formed on a non-planar topography and metal conductive lines formed on the dielectric layer.

42 Claims, 3 Drawing Sheets

1

METHOD FOR MAKING INTERCONNECTS AND SEMICONDUCTOR STRUCTURES USING ELECTROPHORETIC PHOTORESIST DEPOSITION

CROSS REFERENCE TO RELATED APPLICATIONS

This application is a continuation-in-part of copending U.S. patent application, Ser. No. 08/387,687 filed on Feb. 13, 1995 which is a continuation of: application Ser. No. 08/137,675 filed on Oct. 14, 1993, abandoned which is a continuation-in-part of application Ser. No. 07/709,858, filed on Jun. 4, 1991, abandoned; application Ser. No. 07/788,065, filed Nov. 5, 1991, now U.S. Pat. No. 5,440,240; and application Ser. No. 07/981,956 filed Nov. 24, 1992 now U.S. Pat. No. 5,539,324.

This application is related to copending applications Ser. No. 08/335,267 filed Nov. 7, 1994, U.S. Pat. No. 5,483,743; Ser. No. 08/206,747 filed Mar. 4, 1994 U.S. Pat. No. 5,523,697; Ser. No. 08/073,005 filed Jun. 7, 1993, U.S. Pat. No. 5,408,190; Ser. No. 08/124,899 filed Sep. 21, 1993, U.S. Pat. No. 5,495,179; Ser. No. 08/046,675 filed Apr. 14, 1993; Ser. No. 08/073,003 filed Jun. 7, 1993; Ser. No. 08/120,628 filed Sep. 13, 1993; Ser. No. 08/192,023 filed Feb. 3, 1994; Ser. No. 07/896,297 filed Jun. 10, 1992; Ser. No. 08/192,391 filed Feb. 3, 1994; and, Ser. No. 08/137,675 filed Oct. 14, 1993; all of which are incorporated by reference.

FIELD OF THE INVENTION

The present invention relates to a method for electrophoretically depositing a layer of photoresist upon a non-planar silicon structure. Additionally, the present invention relates to a method for fabricating a non-planar silicon structure wherein a thin uniform layer of photoresist is electrophoretically applied to the surface of the structure.

BACKGROUND OF THE INVENTION

In semiconductor processing, the process of photolithography is utilized to pattern the dimensions of various portions of devices and circuits. In the process of photolithography, a form of radiant energy, for example ultraviolet light, is passed through a reticle or mask and onto a target such as a semiconductor wafer. The reticle contains opaque and transparent regions formed in a predetermined pattern. The ultraviolet light exposes the reticle pattern on a layer of photoresist previously formed on the target. The photoresist is then developed for removing either the exposed portions of photoresist for a positive resist or the unexposed portions of photoresist for a negative resist. The patterned photoresist can then be used during a subsequent fabrication process such as etching, deposition or implantation.

Photoresist is conventionally applied to targets by means of a spinning process. In accordance with this process, the target or structure to which the photoresist is to be applied is secured to a chuck. A quantity of photoresist is then deposited in the center of the target which is either already being spun or is subsequently rotated. Centrifugal forces which are created by spinning spread the photoresist across the target with excess photoresist being thrown off the edges of the target. This spinning process results in the application of a layer of photoresist to the target. Other techniques have also been employed to apply a layer of photoresist onto a target. For example, photoresist has been extruded into a continuous sheet form while the target is moved under the extrusion nozzle so as to apply a wide, thick layer of photoresist onto the target. Chemical vapor deposition in which the photoresist is deposited in the presence of a plasma onto the surface of a target has also been used for application of photoresist layers. In addition, resist sputtering techniques have been employed. In general, each of these methods is not entirely suitable for forming a layer of resist on silicon substrates having uneven or non-planar topographies.

In the semiconductor industry, silicon structures are constantly being developed which are non-planar. For example, interconnects for establishing temporary electrical connection to contact locations on unpackaged semiconductor dice have been developed for testing dice to ensure that the reliability thereof is equivalent to packaged dice. These interconnects can include a substrate formed of a material such as silicon. Raised projections can be formed integrally with the substrate as contact members for contacting the contact locations on the dice. These projections are formed in a pattern that matches the size and spacing of the contact locations on the dice. The height of each projection as measured from the top of the substrate to the tip of the projection can vary from a few angstroms to about 100 μm. In a subsequent photopatterning process it is difficult to apply photoresist to the raised projections because the photoresist falls off the raised topography and pools along the lower portions of the substrate.

Another example of a non-planar topography that is difficult to uniformly coat with photoresist occurs in the manufacture of DRAMs. In some cases metallization interconnect layers must be formed on wafers having an extreme topography. An uneven or non-uniform topography can be caused by the stacking of various semiconductor devices beneath the interconnect layers. By way of example commonly assigned, U.S. Pat. No. 5,354,705 to Mathews et al., discloses a method for forming semiconductor container structures having an uneven topography. Coating resist on these types of topographies using conventional techniques leads to a non-uniform resist thickness. The non-uniform resist exposes unevenly, which can result in the loss of some critical dimensions for the circuits ultimately formed. To overcome this problem planarization of uneven surface topographies is sometimes employed using etchback or chemical mechanical planarization (CMP) processes. However, these planarization processes are expensive and time consuming and can introduce other variables into a manufacturing process.

Other silicon structures such as baseplates used to construct field emitter sites for flat panel displays can also have raised topographies and projecting structures of varying height. When it is necessary to apply photoresist to these raised, non-planar topographies, the conventional application methods as described above provide poor results. In particular the photoresist can not be applied with a uniform thickness over the non-planar area and does not adequately cover the tips and sidewalls of various projecting structures or plateaus.

OBJECTS OF THE INVENTION

In view of the foregoing there is a need for an improved method of applying a thin, uniform layer of photoresist to non-planar silicon structures and particularly silicon structures used in the semiconductor industry.

Accordingly, it is an object of the present invention to provide a relatively simple yet effective method of applying a thin, uniform and conformal layer of photoresist to non-planar silicon structures.

It is another object of the present invention to provide a method of applying a thin, uniform and conformal layer of photoresist to non-planar silicon structures which effectively reduces the amount of wasted photoresist.

It is yet another object of the present invention to provide an improved interconnect for testing unpackaged semiconductor dice formed with a conductive layer patterned and etched using an electrophoretically deposited layer of photoresist.

It is yet another object of the present invention to provide an improved method for applying a layer of photoresist to a non-planar topography for patterning metallization lines in the fabrication of semiconductor devices.

Other objects, advantages and capabilities of the present invention will become more apparent as the description proceeds.

SUMMARY OF THE INVENTION

In accordance with the present invention a method for applying photoresist to a non-planar silicon structure and an improved method for fabricating a non-planar silicon structure are provided. The method, simply stated, comprises: forming a silicon substrate with a non-planar topography such as raised projections; forming an electrically conductive material on the substrate; and then electrophoretically depositing a layer of photoresist on the conductive material. Following the deposition process, the deposited layer of photoresist can be exposed and developed using standard techniques. A resultant photomask can then be used for subsequent processing of the conductive layer (e.g., etching, deposition etc.). The electrophoretically deposited layer of photoresist is characterized by a thin and uniform thickness and a high conformability with the topography of the conductive layer. This allows the conductive layer to be etched or otherwise processed with sub micron dimensions.

In an illustrative embodiment, the method is used to fabricate an interconnect for use in testing unpackaged semiconductor dice. The interconnect includes a silicon substrate having contact members formed as raised projections covered with a conductive material. The raised projections are formed in a pattern that matches a pattern of contact locations on a semiconductor die (e.g., bond pads). The conductive material provides a conductive path to the raised projections for applying test signals to the die. The conductive path includes conductive traces formed by electrophoretically depositing a layer of photoresist on the conductive material and then etching the conductive material using the photoresist as an etch mask.

Initially, during fabrication of the interconnect, the raised projections are formed integrally with the silicon substrate using an etching process or an oxidation growth process. Next, an insulating layer is formed on the substrate and projections by growing or depositing an oxide or dielectric layer on the substrate. A conductive material such as a metal or bi-metal stack is then blanket deposited on the insulating layer using a deposition process such as CVD. The substrate is then submerged in an emulsion containing photoresist and a non-sacrificial electrode and the conductive material and electrode are electrically biased by a voltage source.

The photoresist emulsion includes a polymer having a photo initiator and a source of unsaturation for initiating a cross linking reaction. In addition, the photoresist solution includes a carrier group that becomes positively or negatively charged upon contact with either an acid or a base. Depending on the composition of the carrier group and the bias applied by the voltage source, the carrier group causes the photoresist to coat onto the conductive material. Process parameters such as voltage, current, photoresist composition, temperature and electrode size and spacing are controlled to deposit a thin uniform layer of photoresist on the conductive layer including over the sidewalls and tip portions of the raised projections. The electrophoretic deposition process is self limiting in that the photoresist will deposit to a certain thickness and then endpoint without further deposition. The layer of photoresist is then utilized to photopattern and etch the conductive layer into a pattern of conductive traces using conventional exposure, development and etching techniques. Advantageously, the photopatterning process is facilitated by the uniformity and conformability of the electrophoretically deposited layer of photoresist.

In another illustrative embodiment, the method of the invention is utilized to form metal conductive traces on a non-planar surface of a semiconductor wafer. In this case the electrophoretic deposition process is used to apply a uniform layer of photoresist for patterning and etching the conductive traces.

DETAILED DESCRIPTION OF THE INVENTION

Figure 1A:
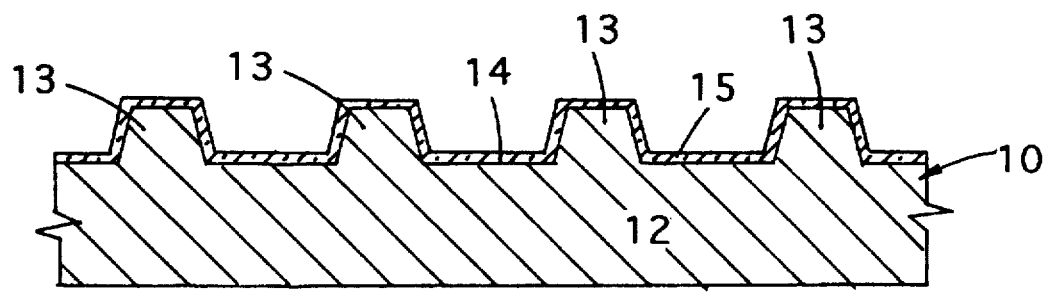
FIGS. 1A–1C are cross sectional views of a non-planar silicon structure at stages of a fabrication process during which a layer of photoresist is electrophoretically deposited in accordance with the invention.

Referring to FIG. 1A, a method for forming a non-planar silicon structure in accordance with the invention is shown. The non-planar silicon structure is illustrated generally as 10. In an illustrative embodiment, the non-planar silicon structure 10 is an interconnect member suitable for establishing a temporary electrical connection with an unpackaged semiconductor die. As will be further explained, the method of the invention can also be used in the formation of other non-planar silicon structures.

The non-planar silicon structure 10 includes a substrate 12 having one or more raised projections 13 extending outwardly therefrom so as to define a non-planar surface 14. For forming an interconnect, the substrate 12 is formed of a material having a coefficient of thermal expansion (CTE) that closely matches the CTE of a silicon die. Suitable materials for the substrate 12 include monocrystalline silicon, silicon-on-glass and silicon-on-sapphire.

The raised projections 13 are generally pyramidal in cross section and include sloped sidewalls and a generally flat tip portion. The raised projections 13 can be formed integrally with the substrate 12 using a wet or dry, isotropic or anisotropic, etch process. During such an etch process, a mask layer (e.g., silicon nitride) is formed on the substrate 12 and then patterned with openings and solid areas to form masking blocks. During the etching process, the raised projections 13 are formed as the substrate 12 under the masking blocks is undercut by the etchant reacting with the substrate 12.

Alternately, in place of an isotropic or anisotropic etch process, the projections 13 can be formed using an oxidizing process. With an oxidizing process the substrate 12 can be subjected to an oxidizing atmosphere to oxidize portions of the substrate 12 not covered by the masking blocks. When the oxide layer is stripped the resultant structure includes raised projections 13.

Various methods for forming a substrate 12 with raised projections 13 are disclosed in copending, commonly assigned U.S. patent application Ser. No. 08/387,687 which is incorporated herein by reference. Depending on the application, these raised projections 13 can be formed with a height of from a few angstroms to 100 µm or more. In addition, the raised projections 13 themselves can also include other projecting structures (not shown) such as penetrating projections for piercing contact locations on a die to a limited penetration depth.

Following formation of the substrate 12 and raised projections 13, an insulating layer 15 is formed on the substrate 12 and raised projections 13. The insulating layer 15 can be formed by oxidation of the substrate 12 or by depositing a suitable insulating or dielectric material on the substrate 12. By way of example, oxidation can be accomplished by exposing the substrate 12 to an oxidizing atmosphere in a reaction chamber to form a layer of silicon dioxide ($SiO_2$). Silicon dioxide can also be deposited using CVD. TEOS (tetraethylorthosilane) can also be injected into a reaction chamber to grow silicon dioxide ($SiO_2$) at a temperature of about 400° C. Another commonly used insulator suitable for forming the insulating layer 15 is $Si_3N_4$ which can be deposited by CVD. A representative thickness for the insulating layer 15 is from about 500 Å to 6000 Å.

Figure 1B:
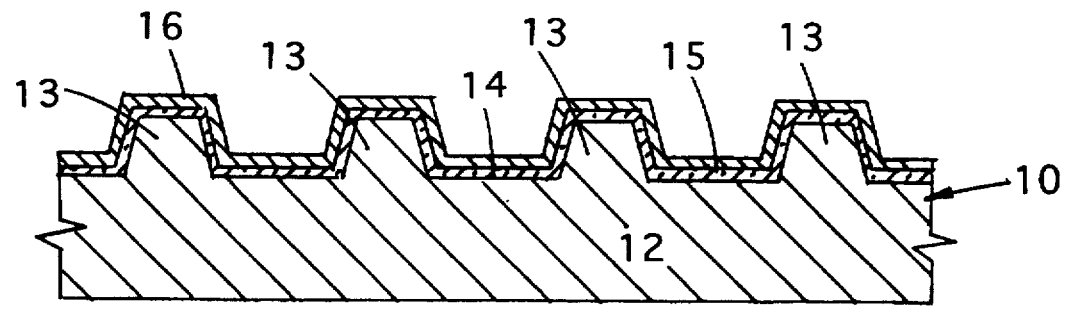

As shown in FIG. 1B, following the formation of the insulating layer 15, a conductive layer 16 is formed over the insulating layer 15. As utilized throughout this specification, the term "conductive layer" denotes a layer of material which possesses sufficient electrical conductivity to permit electrophoretic deposition of an organic coating composition upon a surface thereof.

The conductive layer 16 can be conformably blanket deposited over the insulating layer 15. The conductive layer 16 conforms to the non-planar topography of the substrate 12 and covers the raised projections 13 including the sidewalls and tip portions thereof. Depending on the material, the conductive layer 16 can be deposited using a process such as chemical vapor deposition (CVD) or other suitable process known in the art. The surface 14 of the substrate 12 is preferably cleaned prior to formation of the conductive layer 16, for example by brief contact with a hydrofluoric acid solution.

Preferably the conductive layer 16 is a metal which is selected based upon properties including, but not limited to, electrical resistance, thermal conductivity, strength, and chemical stability. Exemplary metals for use as conductive layer 16 include highly conductive metals such as aluminum and copper. Other suitable metals include the refractory metals, such as titanium (Ti), tungsten (W), tantalum (Ta), platinum (Pt), and molybdenum (Mo). Other suitable metals include cobalt (Co), nickel (Ni), gold (Au) and iridium (Ir). A thickness for the conductive layer 16 is from about 500 Å to about 10 µm.

Figure 2:
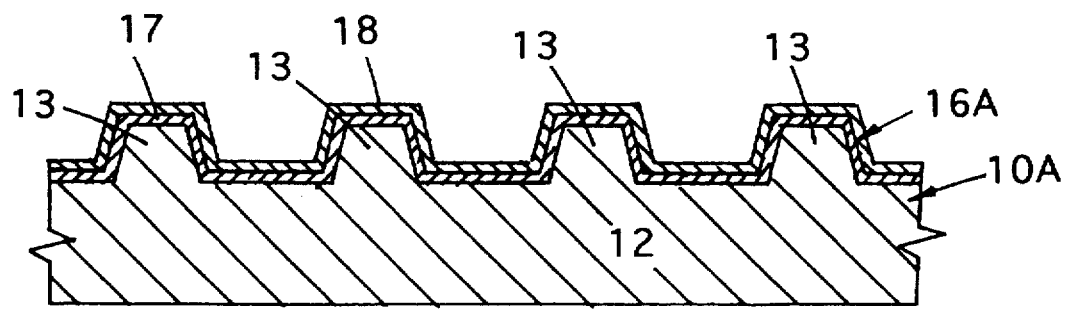
FIG. 2 is a cross sectional view of a non-planar silicon structure having a conductive layer formed thereon as a bi-metal stack.

As illustrated in FIG. 2, the conductive layer 16 can also be formed as a bi-metal stack comprising two or more layers. The bi-metal conductive layer 16A includes a first layer 17 and a second layer 18. The first layer 17 is preferably formed of a highly conductive material that can be patterned and etched to form conductive traces. By way of example, the first layer 17 can be formed of aluminum (Al), tungsten (W) or titanium (Ti).

The second layer 18 is formulated to prevent formation of an oxide layer that would change the resistivity of the contact members ultimately formed by the raised projections 13. In addition, the second layer 18 is formulated to prevent reaction of the conductive layer 16A with the contact location on the die and prevent the diffusion of impurities from the contact location on the die to the first layer 17 and vice versa.

The second layer 18 is preferably a metal that will not easily form a "permanent" or "chemical" bond with the contact locations on the die even under a large mechanical force (e.g., 10 lb./interconnect) and at high temperatures. In addition, this metal must be chemically stable (i.e., non reactive) for temperatures up to about 200° C. By way of example, the second layer 18 can be formed of a metal such as platinum (Pt), titanium (Ti) or a titanium alloy (e.g., TiN, TiW). In some applications the second layer 18 will be formed only on the raised projections 13.

Figure 1C:
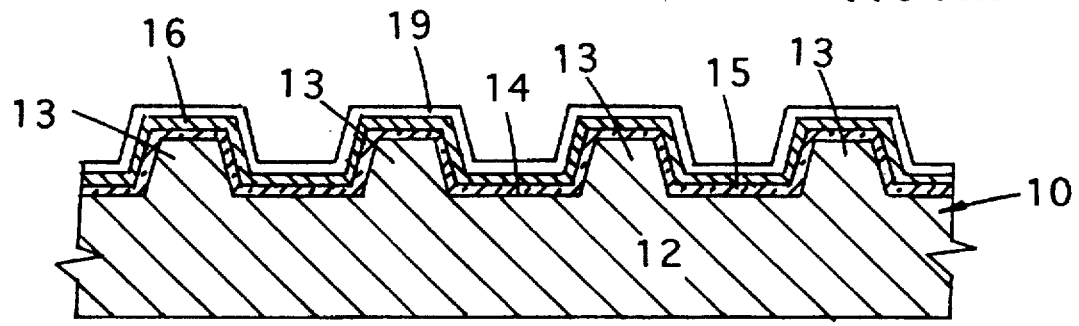

As shown in FIG. 1C, following formation of the conductive layer 16 (or 16A), a layer of photoresist 19 is formed on conductive layer 16 by means of electrophoretic deposition. A negative or positive acting photoresist is provided which is comprised of a polymer and other additives discussed below which are dissolved in a suitable liquid solvent. Although either a negative or positive photoresist layer can be applied by electrophoretic deposition to the conductive layer 16 (or 16A), the method is described below with respect to the application of a negative photoresist.

The polymer of the negative photoresist solution or emulsion contains a carrier group, a photoinitiator and a source of unsaturation for a cross linking reaction. Suitable polymers are addition and condensation polymers which have the carrier groups as described below. Suitable addition polymers preferably include carrier groups which are prepared from monomers having ethylenic unsaturation, for example acrylic and other vinyl polymers, epoxy polymers, polyurethanes, polyester and polyimides.

The carrier group of the polymer will become either negatively or positively charged upon contact with either a base or an acid. Negatively charged carrier groups, i.e., anaphoretic, will cause the polymer to be deposited upon a positively charged conductive layer 16 (or 16A) during the electrophoretic process described below. Polymers containing positively charged carrier groups, i.e., cathaphoretic, will be deposited upon a negatively charged conductive layer 16 (or 16A). Exemplary negative carrier groups include carboxylic acid groups. Exemplary positive carrier groups include sulfonium groups, sulfoxonium groups, and quaternary ammonium groups. Other groups, such as amine groups, which will become positively charged upon reaction with an acid, for example monocarboxylic acids, hydrochloric acid, and phosphoric acid, are also suitable for use in the process of the present invention.

Compositions or emulsions which are formed by mixing a polymer containing carrier groups with at least one unsaturated monomer and a photoinitiator are preferred. The polymer of such compositions or emulsions is capable of being polymerized into a crosslinked polymer upon being exposed to actinic radiation. Preferred unsaturated monomers are those having two or more unsaturated groups attached to the same molecule, while most preferred are multifunctional monomers having two or more acrylate or methacrylate groups attached thereto. Examples of monomers suitable for use in the present invention are disclosed in U.S. Pat. No. 4,592,816 which is incorporated herein by reference.

Photoinitiators which are suitable for use in the composition or emulsion are amines, azo compounds, oxines, sulfur-containing compounds, organic carbonyl compounds, metallic salts and complexes, polynuclear compounds, and quinoes. Specific photoinitiators are also set forth in U.S. Pat. No. 4,592,816.

The photoresist solution or emulsion is formed by mixing an aqueous of polymer with a suitable unsaturated monomer and thereafter adding a photoinitiator which is dissolved in a suitable solvent to the solution. An acid which is used to protonate the carrier groups of the polymer is also added to the mixture. Upon complete mixing, water is also added. The resultant emulsion can be diluted by the further addition of water to adjust the solids content thereof.

TABLE 1

| | (By weight % based on 100 parts of polymer) | | |
| --- | --- | --- | --- |
| | Overall | Preferred | Most Preferred |
| Polymer | 100 | 100 | 100 |
| Unsaturated Monomer | 0–100 | 30–70 | 40–50 |
| Photoinitiator | 1–20 | 3–16 | 10–13 |
| Solvent | 0–200 | 0–100 | 10–13 |
| Base/Acid | 0.5–10 | 1–8 | 2–5 |
| Water | 50–3000 | 100–2000 | 200–1500 |

Coalescing agents, stabilizing agents or film modifiers, and dyes can also be included with the photoresist emulsion to effect various process parameters. One suitable coalescing agent is propylene glycol monomethyl ether included to up to 25% by weight but most preferably between about 4–6% by weight. Stabilizing agents can also be added to prevent premature cross linking of the monomers or polymers. Exemplary stabilizing agents include hydroquinine and phenothiazine added to up to 3% by weight and most preferably between 0.3% and 0.5%. Dyes can also be added in order to change the resolution. Exemplary dyes include triarylmethane dyes such as methylviolet added to less than 1% by weight of the emulsion solids.

An especially preferred photoresist emulsion for use in the process of the present invention is sold by Shipley Company Inc., Newton, Mass. under the trademark PEPR™ XP-2305. This is a positive tone, water based photoresist suitable for exposure to actinic radiation at wavelengths between 340–440 nm.

Figure 3:
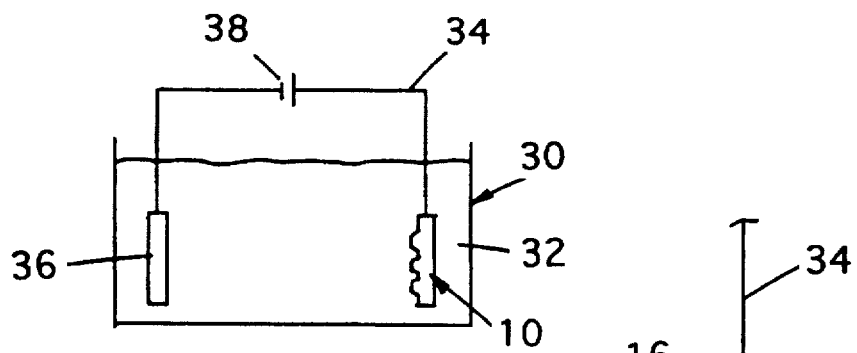
FIG. 3 is a schematic view of a non-planar silicon structure during an electrophoretic deposition process in which the structure is positioned within a bath containing a photoresist solution and a non sacrificial electrode.

Referring now to FIG. 3, deposition of the layer of photoresist 19 is illustrated. The non-planar silicon structure 10 formed with a conductive layer 16 (FIG. 1B) is submerged within an electrolytic bath 30. The electrolytic bath 30 includes a suitable photoresist emulsion 32 as described above. In addition, the electrolytic bath 30 includes a non-sacrificial electrode 36 formed of a metal such as stainless steel. The conductive layer 16 (FIG. 1B) of the silicon structure 10 and the non-sacrificial electrode 36 are electrically connected by suitable circuitry 34 to a voltage source 38.

Figure 3B:
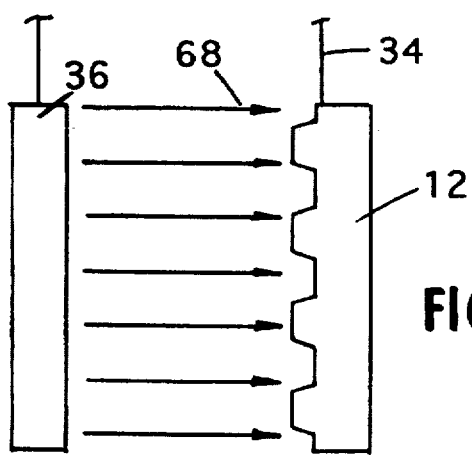
FIG. 3B is an enlarged schematic view of the structure and electrode during electrophoretic deposition illustrating a preferred current distribution from the electrode to the structure.
Figure 3A:
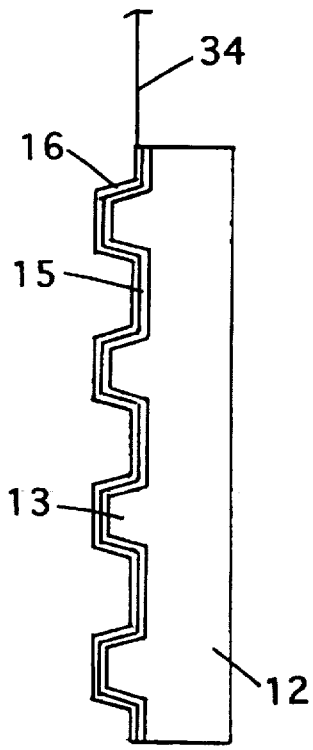
FIG. 3A is an enlarged schematic view of the structure within the bath showing the electrical connection to a conductive layer formed on the structure.

FIG. 3A shows the electrical connection between the conductive layer 16 and the circuitry 34. Preferably, as shown in FIG. 3B, the surface area of the electrode 36 is at least equal to or greater than the surface area of the substrate 12. This provides a substantially uniform current distribution 68 from the electrode 36 to the substrate 12.

Referring back to FIG. 3, the voltage source 38 applies an electrical bias to the conductive layer 16 and electrode 36. Depending on the carrier group used to formulate the photoresist emulsion 32, the conductive layer 16 can be biased to a positive or a negative elective potential. This electrical bias attracts the carrier group to the conductive layer 16 and forms the layer of photoresist 19 (FIG. 1C) as a thin uniform layer. During the deposition process the substrate 12 can be vibrated to displace bubbles formed during the process.

Prior to the electrophoretic deposition process it is helpful to thoroughly clean the conductive layer 16 to remove impurities. A cleaning solution such as Spray Cleaner 742 manufactured by Shipley can be used for cleaning and rinsing the conductive layer 16. Dionized water can also be used to clean the conductive layer and for a final rinse. In addition to cleaning the conductive layer 16, a priming agent such as hexamethyldisilazene (HMDS) can be applied to the conductive layer 16.

It is also helpful to wet the conductive layer 16 with the photoresist emulsion 32 prior to the deposition process in order to help prevent the formation of bubbles which can cause pin holes in the deposited photoresist 19 (FIG. 1C). Wetting can be accomplished by spraying or by dipping and then removing the substrate 12 from the emulsion 32 one or more times.

Using the electrophoretic deposition process, the photoresist 19 (FIG. 1C) can be deposited to a thickness of from about 5000 Å to 15 μm. The electrophoretic deposition process is self limiting in that the photoresist will deposit onto the conductive layer 16 to a certain thickness and then endpoint. This phenomena is believed to be caused by the insulating character of the photoresist as it deposits on the conductive layer 16. The deposition time is relatively short (e.g., less than a minute) and is primarily a function of the temperature and formulation of the photoresist emulsion 32 and the voltage to the electrode 36.

By way of example and not limitation, Table 2 lists a range of process parameters suitable for practicing the method of the invention.

TABLE 2

| Parameter | Range |
| --- | --- |
| Temperature | 15° C. to 40° C. |
| Current | 0.1 mA to 2 amps |
| Voltage | 50 volts to 500 volts |
| Concentration of Emulsion | 0.5N to 2.0N |

TABLE 2-continued

| Parameter | Range |
| --- | --- |
| Separation Distance Substrate/Electrode | 0.3 in. to 5 in. |
| Time | 0.1 secs. to 1 minute |
| Thickness of resist (19) | 5000 Å to 15 μm |

At the completion of the electrophoretic deposition process, the substrate 12 is removed from the electrolytic bath 30. The deposited layer of photoresist 19 (FIG. 1C) is characterized by a uniform thickness which extends across the non-planar topography of the substrate 12. In addition, the photoresist 19 conformably deposits on the sidewalls and tips of the conductive layer 16 (FIG. 1C) overlying the raised projections 13.

Following the deposition process, the electrophoretically deposited layer of photoresist 19 can be exposed and developed to form a photomask for etching the conductive layer 16 (FIG. 1C). Conventional techniques can be used to expose and develop the photoresist 19. By way of example, the photoresist 19 can be exposed by exposure to appropriate radiant energy, for example ultraviolet light, which is passed through a reticle or mask which is patterned in a predetermined manner. The ultraviolet light exposes the reticle pattern on the layer of photoresist 19 which is then developed upon contact with acidic or basic solutions to remove either the exposed portions of photoresist for a positive resist or the unexposed portions of resist for a negative resist.

Figure 4:
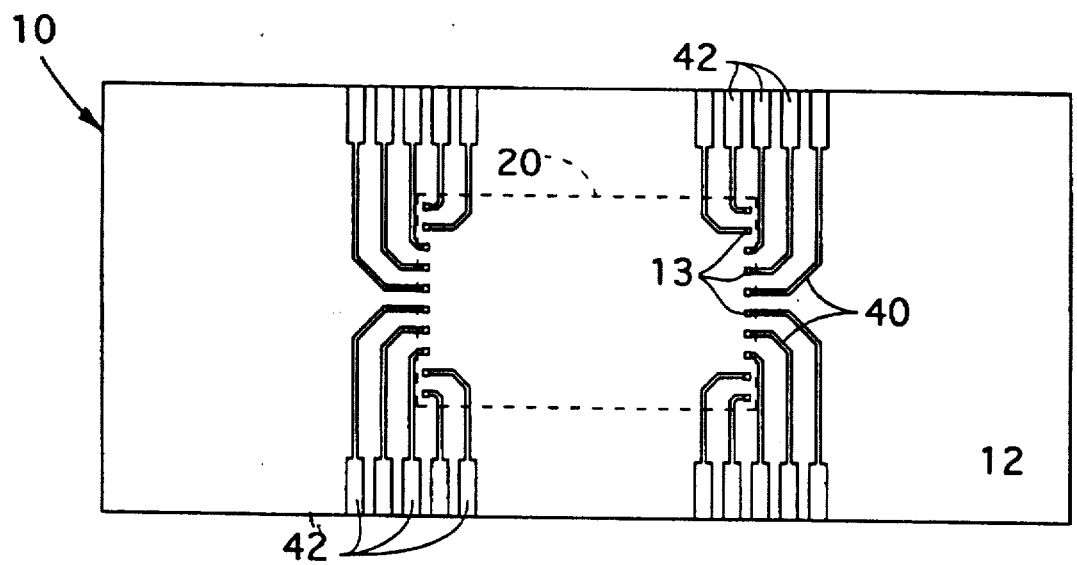
FIG. 4 is a plan view of an interconnect formed in accordance with the invention.

The conductive layer 16 (FIG. 1C) can then be etched using the exposed and developed layer of photoresist 19 as a photomask. FIG. 4 shows the completed silicon structure 10 used as an interconnect for testing a semiconductor die 20. Preferably a large number of silicon structures 10 have been fabricated on a single wafer and then singulated using a diamond tipped saw. Each silicon structure 10 is generally rectangular in shape and is about twice the size and surface area of the die 20. The raised projections 13 are arranged in a pattern that matches the pattern of contact locations on the die 20. Each raised projection 13 is covered with the conductive layer 16 (FIG. 1C) which has been patterned to form conductive traces 40. Each conductive trace 40 extends to an edge of the substrate 10 and terminates in a connection pad 42. The connection pads 42 are for connection to bond wires or mechanical connectors for establishing an electrical pathway to external circuitry (e.g., test circuitry). This electrical pathway allows signals to be transmitted from external test circuitry, through the conductive traces 40 (FIG. 4), through the conductive layer 16 (FIG. 1C) for each raised projection 13 and to a mating contact location on the semiconductor die 20.

Referring now to FIGS. 5A–5D, the method of the invention is illustrated in the formation of metallization lines on an uneven surface of a semiconductor structure 50. The semiconductor structure 50 includes a silicon substrate 52. Semiconductor devices 56 are formed on the substrate 52 in accordance with well known semiconductor fabrication techniques. The semiconductor devices 56 are represented schematically and can include various devices such as field effect transistors (FETs) and storage capacitors. A dielectric layer 58 formed of a material such as borophosphosilicate glass (BPSG) has been formed on the substrate 52 over the semiconductor devices 56. Because of the non-planar topography of the semiconductor devices 56, the dielectric layer 58 has a non-planer or uneven surface. Such a non-planar surface can create dimensional variations during a subsequent photopatterning process.

Figure 5A:
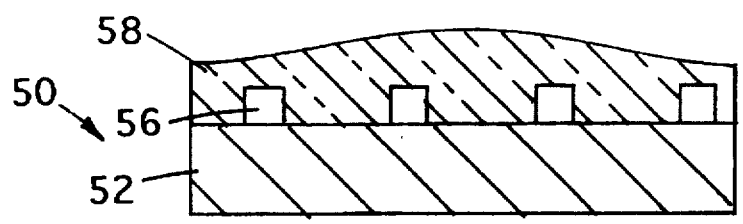
FIGS. 5A–5D are schematic cross sectional views illustrating the method of the invention in the formation of metal conductive traces on an uneven surface of a semiconductor wafer.
Figure 5B:
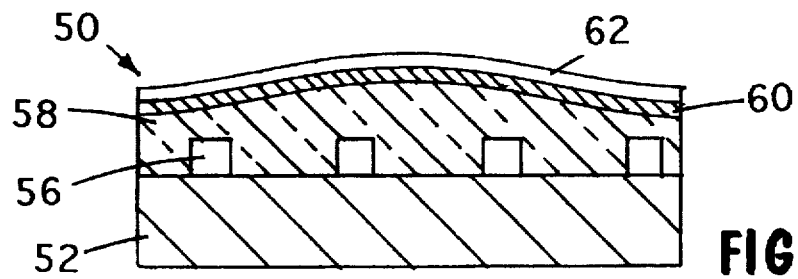

Next, as shown in FIG. 5B, a conductive layer 60 formed of a highly conductive metal, such as aluminum, is blanket conformably deposited on the surface of the dielectric layer 58. A layer of resist 62 is then electrophoretically deposited on the conductive layer 60 in accordance with the method of the invention. Even though the surface of the conductive layer 60 is uneven the resist 62 is deposited with a uniform thickness.

Figure 5C:
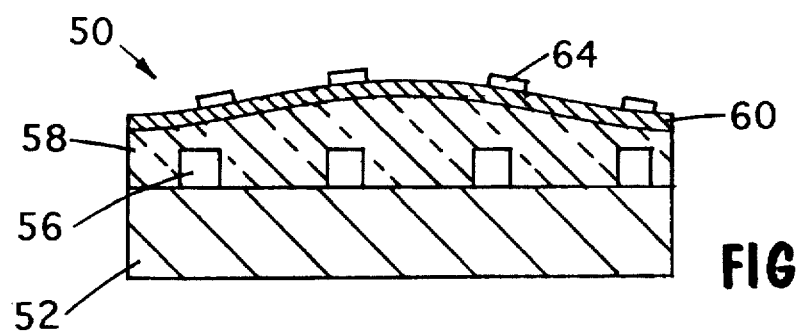
Figure 5D:
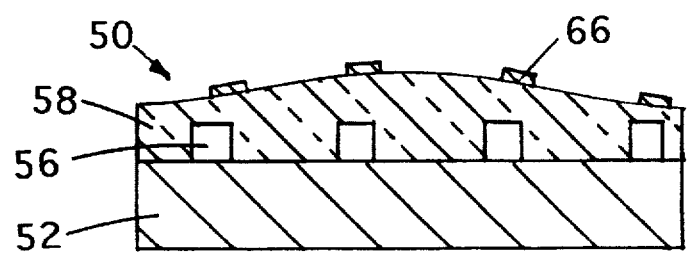

Next, as shown in FIG. 5C, the layer of resist is exposed and developed to form a mask 64. As shown in FIG. 5D, the mask is then utilized to etch the conductive layer 60 to form metal conductive lines 66.

EXAMPLE

The method of the invention was evaluated using PEPR™ XP-2305 positive electrodeposited photo resist manufactured by Shipley Company Inc., Newton Mass. The photoresist was diluted by adding water to form a 1:1 solution. The bath temperature was 25° C. The voltage at the anode was 120 volts. The method was used to electrophoretically deposit photoresist onto silicon substrates formed with Cu and Al conductive layers respectively. In both cases these metals were sputtered onto a layer of $SiO_2$ formed on the silicon substrates to a thickness of approximately 6000 Å. The thickness of the conductive layers varied between about 1000 Å to 3 μm.

Prior to submerging these substrates into the bath they were cleaned to remove any metal oxides. In the case of the Al conductive layer, a 100:1 solution of $HF:H_2O$ was used to clean the substrates. The substrates were then thoroughly rinsed in DI water. This was followed by surface pretreatment using an hexamethyldisilazane (HMDS) vapor prime. In addition, prior to the electrophoretic deposition process the substrates were wetted with the photoresist solution. This was accomplished by dipping and withdrawing each substrate from the solution several times. The dipping helps to prevent bubbling at the surface of the substrate and improves the uniformity of the electrophoretic deposition process.

Figure 6:
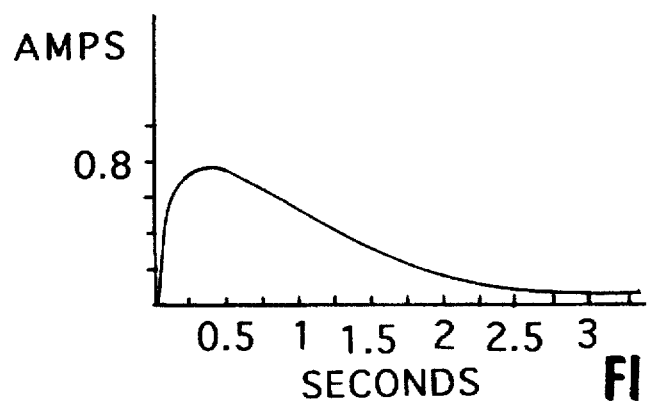
FIG. 6 is a graph showing a typical current profile (current vs. time) during electrophoretic deposition in accordance with the invention.

As shown in FIG. 6, current was seen to increase quickly to a maximum value and then slowly fall to zero over the course of several seconds. Following the electrophoretic deposition process the deposited layer of resist was softbaked at a temperature of between 110° C. to 120° C. for two minutes using a proximity bake hotplate. The layer of resist was then exposed thorough a mask at 400 nm and developed with a solution of KOH.

Thus the invention provides a method for electrophoretic deposition of a layer of photoresist upon a non-planar surface of a silicon structure. This method results in a uniform thickness of photoresist being applied without any significant attendant waste. In addition, it allows photopatterning of features with sub micron dimensions. Although preferred materials have been described, it is to be understood that other materials may also be utilized. Furthermore, although the method of the invention has been described with reference to certain preferred embodiments, as will be apparent to those skilled in the art, certain changes and modifications can be made without departing from the scope of the invention as defined by the following claims.

What is claimed is:

1. A method for fabricating an interconnect for a semiconductor die, said method comprising:

providing a silicon substrate;

forming a raised projection on the substrate comprising sidewalls and a tip portion;

depositing an electrically conductive layer on the substrate and on the sidewall and tip portion of the raised projection;

electrophoretically depositing a layer of photoresist on the conductive layer;

exposing and developing the layer of photoresist to form a mask; and patterning the conductive layer using the mask.

2. The method as claimed in claim 1 and further comprising forming an insulating layer between the substrate and conductive layer.

3. The method as claimed in claim 1 and wherein the raised projection is formed with a height of from 1 μm to 100 μm.

4. The method as claimed in claim 1 and further comprising wetting the raised projection with photoresist prior to the electrophoretic deposition step.

5. The method as claimed in claim 1 and further comprising electrophoretically depositing the layer of photoresist with a substantially uniform current density across a surface of the substrate.

6. The method as claimed in claim 1 and wherein the electrically conductive layer comprises a material selected from the group consisting of aluminum, copper, titanium, tungsten, tantalum, platinum, molybdenum, cobalt, nickel, gold and iridium.

7. The method as claimed in claim 1 and wherein the electrically conductive layer is formed as a bi-metal stack including a non-oxidizing outer layer.

8. The method as claimed in claim 1 and wherein the layer of photoresist is electrophoretically deposited to a self limiting thickness.

9. The method as claimed in claim 1 and wherein the layer of photoresist is electrophoretically deposited to a thickness of about 5000 Å to about 15 μm.

10. A method for fabricating a silicon structure comprising:

forming a silicon substrate having a raised projection comprising sidewalls and a tip portion;

conformably depositing a conductive layer on the substrate and on the sidewalls and tip portion of the raised projection;

submerging the silicon substrate in a solution of photoresist formed with a charged carrier group;

electrically connecting the conductive layer to a voltage source and to an electrode located within the photoresist solution;

applying a voltage to the electrode and to the electrically conductive layer to electrophoretically deposit a layer of photoresist upon the conductive layer; and exposing and developing the layer of photoresist to form a mask for patterning the conductive layer.

11. The method as claimed in claim 10 and wherein a surface area of the electrode is equal to or greater than a surface area of the substrate.

12. The method as claimed in claim 10 and further comprising wetting the substrate with the photoresist solution prior to the submerging step.

13. The method as claimed in claim 10 and wherein the voltage during the applying step is from about 50 volts to about 500 volts.

14. The method as claimed in claim 10 and wherein the voltage is applied during the applying step for a duration of about 0.1 seconds to about 60 seconds.

15. The method as claimed in claim 10 and wherein a temperature of the photoresist solution during the submerging step is from about 15° C. to about 40° C.

16. The method as claimed in claim 10 and wherein a distance between the electrode and the silicon substrate during the applying step is from about 0.3 inches to about 5 inches.

17. The method as claimed in claim 10 and wherein the carrier group comprises an unsaturated monomer.

18. The method as claimed in claim 10 and further comprising:

etching the conductive layer using the layer of photoresist.

19. The method as claimed in claim 10 and further comprising:

exposing the electrophoretically deposited layer of photoresist by exposure to radiant energy which is passed through a reticle.

20. The method as claimed in claim 19 and further comprising:

developing the exposed layer of photoresist with a developing solution.

21. The method as claimed in claim 10 and wherein the structure comprises an interconnect for a semiconductor die.

22. A method for making a semiconductor structure comprising:

forming a silicon substrate with a non-planar topography;

conformably depositing a conductive layer on the substrate;

electrophoretically depositing a layer of photoresist on the conductive layer;

exposing and developing the layer of photoresist to form a photomask; and using the photomask to pattern the conductive layer.

23. The method as recited in claim 22 and wherein a surface area of an electrode during the electrophoretic depositing step is at least as great as a surface area of the substrate.

24. The method as recited in claim 22 and wherein the substrate is predipped in photoresist prior to the electrophoretic depositing step.

25. The method as recited in claim 22 and further comprising priming a surface of the conductive layer prior to the electrophoretic depositing step.

26. The method as recited in claim 22 and wherein the substrate includes a plurality of raised projections for forming contact structures for establishing an electrical connection to contact locations on the semiconductor die.

27. The method as recited in claim 26 and further comprising etching the conductive layer using the photomask to form conductive traces to the contact structures.

28. The method as recited in claim 27 and wherein each projection is formed with a height of from 1 μm to 100 μm.

29. The method as recited in claim 28 and wherein the conductive layer and conductive traces are formed of a same material.

30. The method as recited in claim 28 and wherein the conductive layer is formed as a bi-metal stack.

31. The method as claimed in claim 22 and wherein the substrate includes semiconductor devices.

32. A method for forming an interconnect for testing an unpackaged semiconductor die, comprising forming a substrate with a plurality of raised projections corresponding to contact locations on the die;

forming an insulating layer on the substrate and projections;

conformably depositing a conductive layer on the insulating layer;

electrophoretically depositing a layer of photoresist on the conductive layer;

exposing and developing the layer of photoresist to form a photomask; and patterning the conductive layer using the photomask.

33. The method as recited in claim 32 and wherein the raised projections include a sidewall and a tip portion covered by the conductive layer.

34. The method as recited in claim 32 and wherein the conductive layer comprises a material selected from the group consisting of aluminum, copper, titanium, tungsten, tantalum, platinum, molybdenum, cobalt, nickel, gold and iridium.

35. The method as recited in claim 32 and wherein a surface area of the electrode is equal to or greater than a surface area of the substrate.

36. The method as recited in claim 32 and wherein the substrate is predipped in a solution of photoresist.

37. The method as recited in claim 32 and wherein a voltage source establishes a voltage of from about 50 volts to about 500 volts during the electrophoretic depositing step.

38. The method as recited in claim 32 and wherein a voltage is applied during the electrophoretic depositing step for a duration of about 0.1 seconds to about 60 seconds.

39. The method as recited in claim 32 and wherein a temperature of the photoresist during the electrophoretic depositing step is from about 15° C. to about 40° C.

40. The method as recited in claim 32 and wherein a distance between an electrode and the substrate during the electrophoretic depositing step is from about 0.3 inches to about 5 inches.

41. The method as recited in claim 32 and further comprising priming a surface of the conductive layer prior to the electrophoretic depositing step.

42. The method as recited in claim 41 and wherein the surface is primed with hexamethyldisilazane (HMDS).

* * * * *